United States Patent [19]

Uchino et al.

[11] Patent Number: 4,773,047
[45] Date of Patent: Sep. 20, 1988

[54] READ ONLY MEMORY DEVICE

[75] Inventors: Yukinori Uchino; Hiroaki Suzuki, both of Yokohama, Japan

[73] Assignee: Kabushiki Kaisha Toshiba, Kawasaki, Japan

[21] Appl. No.: 874,469

[22] Filed: Jun. 16, 1986

[30] Foreign Application Priority Data

Jun. 17, 1985 [JP] Japan ................................ 60-131373

[51] Int. Cl.[4] .............................................. G11C 11/40
[52] U.S. Cl. .................................... 365/181; 365/189
[58] Field of Search ............... 365/103, 181, 190, 189, 365/205, 230

[56] References Cited

U.S. PATENT DOCUMENTS 3,550,089 12/1970 Ahrons .
4,228,527 10/1980 Gerber et al. ........................ 365/181
4,532,439 7/1985 Kioke ................................... 365/181

FOREIGN PATENT DOCUMENTS 2563651 10/1985 France .

OTHER PUBLICATIONS

"A Modular Memory Building Block Approach for VLSI", by Mazin et al., IEE Custom Integrated Circuits Conference, pp. 258–263, 1985.

Primary Examiner—Terrell W. Fears
Attorney, Agent, or Firm—Foley & Lardner, Schwartz, Jeffery, Schwaab, Mack, Blumenthal & Evans

[57] ABSTRACT

A read only semiconductor memory device which comprises a plurality of transistor pairs comprising two transistors of one and the other conductivity types arranged in a matrix manner, thus allowing only one of the two transistors constituting each transistor pair to be operated to obtain a predetermined logical output. By employing a structure of the transmission gate type as the transistor pair, high speed and reliable operation for raising a potential on the output line can be realized.

14 Claims, 7 Drawing Sheets

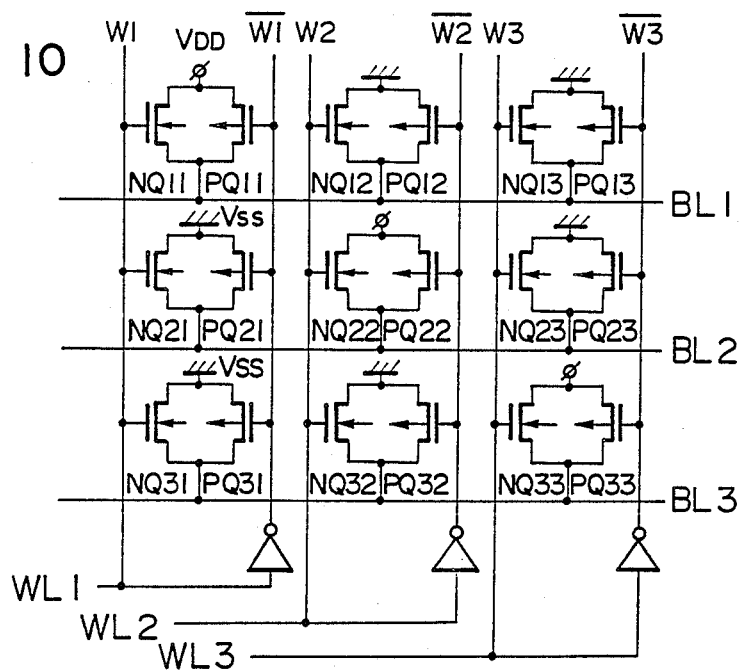
F I G. 10
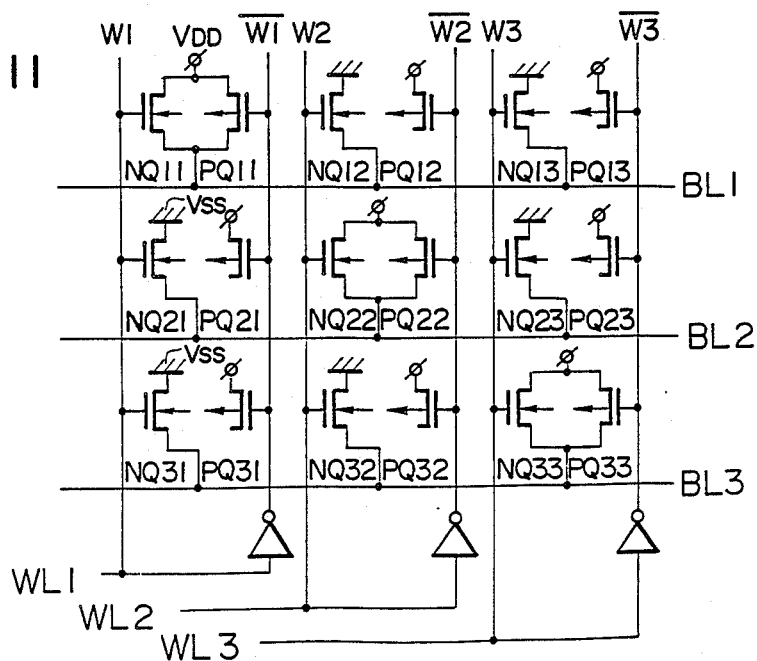
F I G. 11

READ ONLY MEMORY DEVICE

BACKGROUND OF THE INVENTION

The present invention relates to a read only semiconductor memory device, and more particularly to a read only memory device used in a memory device constituting a CMOS gate array fabricated using the master slice approach.

In general, gate array LSIs are used as circuitry having an intermediate character between microcomputers which obtain various functions utilizing software and custom made LSIs based on hard specification of users.

Such gate array LSIs can obtain desired hardware functions by interconnecting several hundred to thousand of gate circuit blocks provided on a chip in advance on the basis of the users' specification, and they are ordinarily fabricated in accordance with the master slice approach to vary the wiring pattern between unit cells in the wiring area according to the kind of the products so as to meet users' design specification.

Meanwhile, among recently available gate array LSIs, there are many ones such that gates are contiguously arranged also in wiring areas which have been provided between gate columns in the art to form a structure of the type comprising gates on the entire source, which is generally referred to as SOG (Sea of Gate), thereby improving the element density to assemble memory units as arbitrary positions. In this instance, the logic of the gates is realized by ROM (Read Only Memory) device.

FIG. 1 is a circuit diagram illustrating one example of an essential part of a ROM of the OR type used in a conventional read only semiconductor memory device. As seen from this figure, source grounded n-channel transistors Q11, Q12, Q13, Q21, ..., Q23, and Q31 to Q33 are arranged in a matrix manner. This ROM circuit is provided with word lines WL1, WL2, and WL3 commonly connected to gates of transistors of the same columns, respectively, and bit lines BL1, BL2 and BL3 commonly connected to drains of transistors of the same rows, respectively. To these bit lines BL1, BL2 and BL3, drains precharging p-channel transistors Q1, Q2 and Q3 are connected, respectively wherein their gates are commonly connected to a precharge circuit 1 and their sources are connected to a drain supply voltage $V_{DD}$ (which will be simply call "$V_{DD}$" hereinafter). Their drains of these transistors Q11, Q22 and Q33 are separated from the bit lines BL1, BL2 and BL3, respectively.

In this circuit, one first activate the precharge circuit 1 by a clock signal to place each bit line in a high (H) level. In this condition, when a word line selection is made, a transistor connected to the bit line is turned on, with the result that the concerned bit line is pulled down to low (L) level. However, such a pulldown does not occur in the transistor in which the drain and the bit line are separated from each other. As a result, a memory output appears on the bit line. Accordingly, this circuit can be called the circuit of the synchronous type, giving rise to the problem in use that it is required to precisely adjust the clock for precharge and the timing of an input address signal for selection of the word line.

FIG. 2 is a circuit diagram illustrating a conventional ROM circuit of the ratio type configured so that bit lines are always respectively pulled up by resistors R1, R2 and R3 instead of the precharge circuit and the p-channel transistors shown in FIG. 1. This circuit is of the asynchronous type because the bit lines are always pulled up independent of the selection of the word lines, resulting in no problem in the timing. However, this circuit has the shortcoming that a large d.c. current flows every time the address changes, resulting in large power dissipation.

FIG. 3 is a circuit diagram illustrating a further conventional ROM circuit used in the gate array in the prior art. This circuit is characterized in that the transistors Q11, Q22 and Q33 for producing a predetermined output are arranged so that their sources are connected to $V_{DD}$ instead of separation between the drains and the bit lines as in the prior art, thus providing a ROM of the asynchronous type and having a low power dissipation.

Because an output is small in this circuit, there is employed a circuit arrangement to pass each output through a p-channel transistor having a source connected to $V_{DD}$ and a compensation (sense-up) circuit comprising two stages of inverters, thereby allowing a slow rising of the potential on the bit line after selection of the word line to be changed into a quick and steep rising on the output line as shown in FIG. 4.

However, with such a compensation circuit, when the threshold voltage $V_{TH}$ of the n-channel transistor shifts to an upper voltage and that of the p-channel transistor shifts to a lower voltage due to the variation at the time of fabrication, the circuit threshold voltage $V_{TH}$ of the inverter becomes high. Accordingly, in the event that the H level on the bit line pulled up by the n-channel transistor of which source is connected to $V_{DD}$ by the selection of the word line is lowered by the circuit $V_{TH}$ of the inverter, there is a possibility that this circuit does not normally operate. Namely, the drawback with this circuit is that the range of the threshold voltage $V_{TH}$ is limited, resulting in small margin in the production and poor mass-productivity.

In addition, since the memory elements are constituted using only n-channel transistors in the above-mentioned three ROM circuits, the drawback with these circuits is that the p-channel transistor is not used in the COMS gate array, resulting in low element utilization factor.

SUMMARY OF THE INVENTION

An object of the present invention is to provide a semiconductor ROM device of the asynchronous type having low power dissipation.

Another object of the present invention is to provide a semiconductor ROM device having excellent mass-productivity.

A further object of the present invention is to provide a semiconductor ROM device having high element utilization factor.

A still further object of the present invention is to provide a semiconductor ROM device which securely operates at a high speed.

To achieve these objects, a read only semiconductor memory device according to the present invention is provided with a plurality of transistor pairs arranged in a matrix manner, each transistor pair comprising a transistor of one conductivity type responsive to one input to output one logic and a transistor of an opposite conductivity type responsive to one input to output the other logic, input lines for connecting transistors of the same columns of the transistor pairs, and output lines for connecting transistors of the same rows of the transistor pairs, thus allowing only one of the two transistors constituting each transistor pair to be operated to produce a predetermined logical output. As another aspect of the present invention, a read only semiconductor ROM device is provided with a plurality of transistor pairs arranged in a matrix manner, each transistor pair comprising a transistor of one conductivity type and a transistor of an opposite conductivity type which are commonly connected at their sources and drains, respectively, input lines for connecting transistors of the same columns of the transistor pairs, and output lines for transistors of the same rows of the transistor pairs, a point at which sources of the transistor pair for outputting one logic are commonly connected being connected to a source for delivering a power having one level, a point at which sources of the transistor pair for outputting the other logic are commonly connected being connected to a source for delivering a power having the other level. As a further aspect of the present invention, a semiconductor ROM device is provided with a plurality of transistor pairs arranged in a matrix manner, each transistor pair comprising a transistor of one conductivity type responsive to one input to output one logic and a transistor of an opposite conductivity type responsive to one input to output the other logic, input lines for connecting transistors of the same columns of the transistor pairs, and output lines for connecting transistors of the same rows of the transistor pairs, the transistor pair outputting one logic constituting the transistor pairs comprising transistors which are commonly connected at their sources and drains, respectively, a point at which sources of the transistor pair outputting one logic are commonly connected being connected to a source for delivering a power having one level, a point at which drains of the transistor pair outputting one logic are commonly connected being connected to the output lines, respectively, the transistor pair outputting the other logic constituting the transistor pairs being such that only the transistor of the opposite conductivity type for pulling down the output line to the other level is operated.

Thus, there is provided a read only semiconductor memory device of the asynchronous type, and having low power dissipation and excellent area occupation ratio.

BRIEF DESCRIPTION OF THE DRAWINGS

In the accompanying drawings:

FIG. 10 is a circuit diagram illustrating an embodiment of a ROM according to the present invention wherein each transistor pair is configured as a transmission gate;

FIG. 11 is a circuit diagram illustrating a modification of the circuit shown in FIG. 10;

DETAILED DESCRIPTION OF THE PREFERRED EMBODIMENTS

Figure 1:
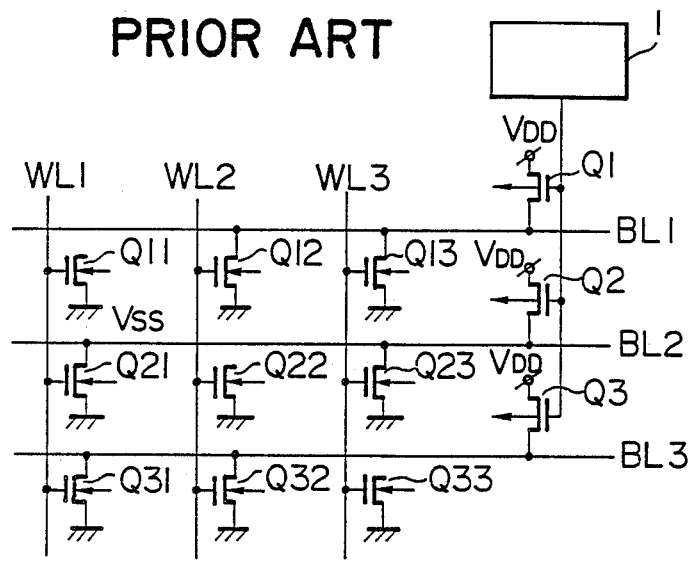
FIG. 1 is a circuit diagram illustrating a conventional ROM device of the synchronous type.
Figure 2:
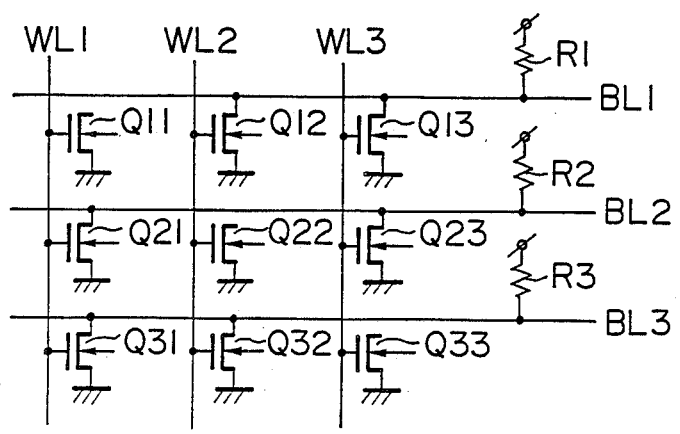
FIG. 2 is a circuit diagram illustrating a conventional ROM device of the ratio type.
Figure 3:
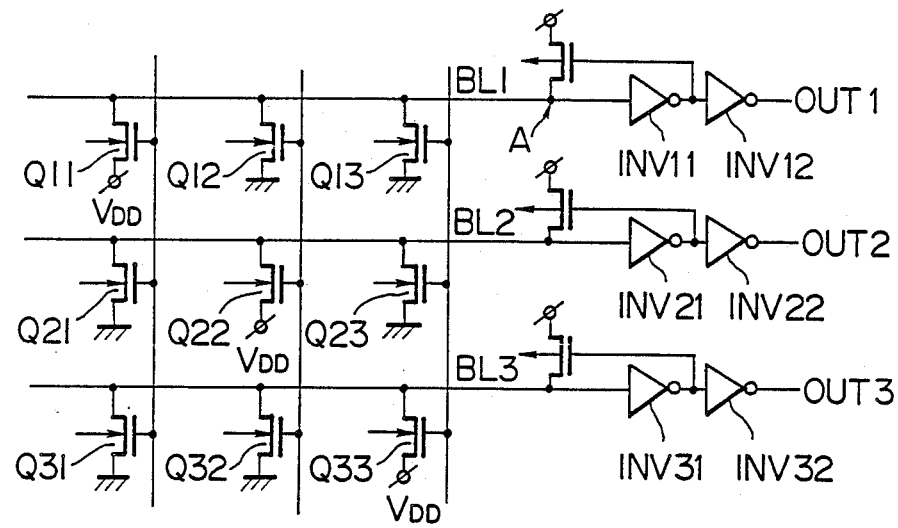
FIG. 3 is a circuit diagram illustrating a conventional ROM device having compensation circuitry.
Figure 4:
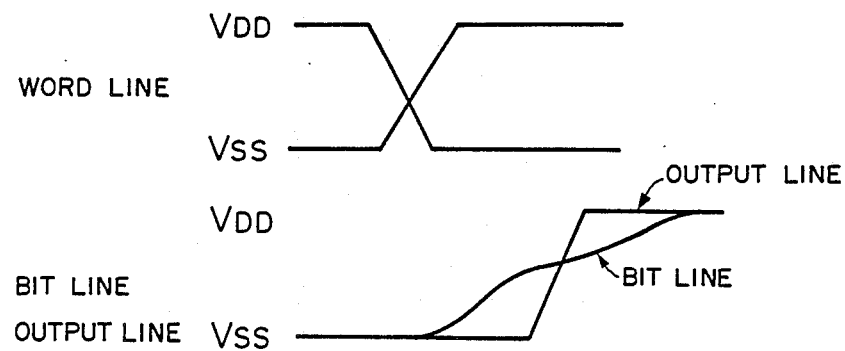
FIG. 4 is a graph showing a transient characteristic in the circuit shown in FIG. 3.
Figure 5:
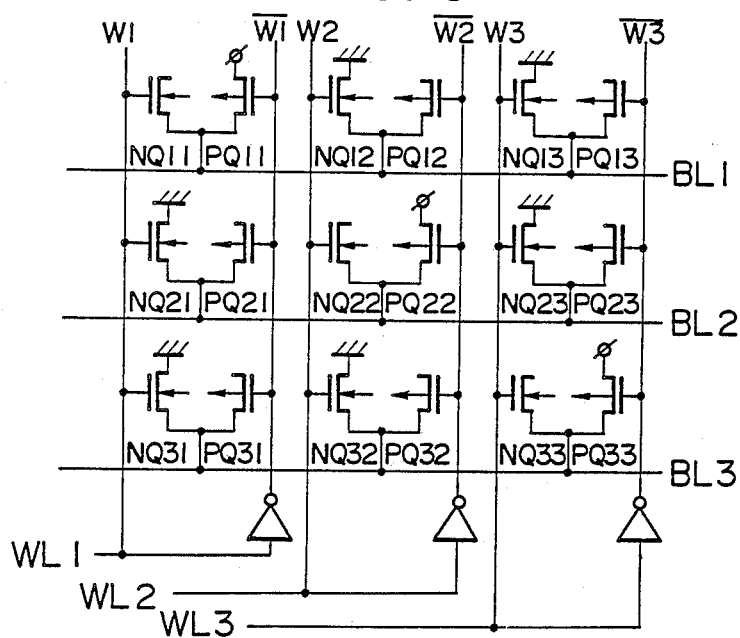
FIGS. 5 through 8 are circuit diagrams illustrating embodiments of ROM devices according to the present invention, respectively.

FIG. 5 is a circuit diagram illustrating an embodiment of a read only semiconductor device according to the present invention. In a gate array of the master slice type n-channel transistor columns and p-channel transistor columns are arranged alternately on a master chip, ROMs of the OR type are formed. In accordance with this circuit, each transistor pair comprises n-channel and p-channel transistors commonly connected at their drains. A point at which the drains are commonly connected is connected to a bit line BL. Each gate of the n-channel transistors of the same column (first column) is connected to a word line of logic W1 and each gate of the p-channel transistors thereof is connected to a word line of the negative logic $\overline{W1}$. This negative logic $\overline{W1}$ is obtained by bran-ching the word line WL of the logic W1 through an inverter. In the transistor pairs giving the meaning of logical "1" in each column, for instance as shown in the first row and the first column, the source of an n-channel transistor NQ11 is in an open state and the source of a p-channel transistor PQ11 is connected to $V_{DD}$. In contrast, in the transistor pairs giving the meaning of logical "0", for instance as shown in the second row and the first column, and the third row and the first column, sources of n-channel transistors NQ21 and NQ31 are connected to a source power supply voltage $V_{SS}$ (which will be simple called "$V_{SS}$" hereinafter), and sources of p-channel transistors PQ21 and PQ31 are in an open state.

In this circuit, when a word line WL1 is selected and the logic W1=1 is input, the n-channel transistors NQ21 and NQ31 are turned on, thus pulling bit lines BL2 and BL3 down to the ground level. At this time, since the p-channel transistor PQ11 which is turned on when the logic $\overline{W1}$ is 0, raises the bit line BL1 to the $V_{DD}$ level, data indicative of logical "1", "0" and "0" are output on the bit lines BL1, BL2 and BL3, respectively.

Figure 6:
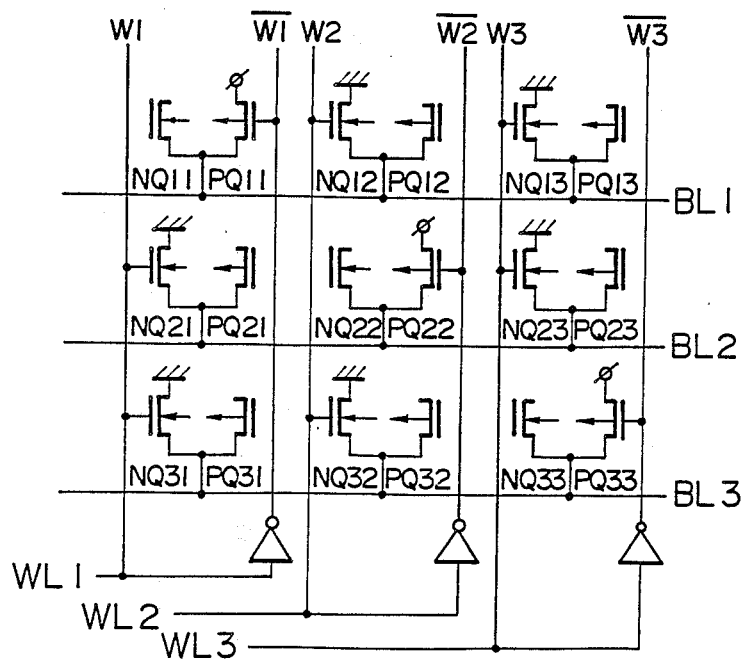

FIG. 6 is a circuit diagram illustrating a modification of the circuit shown in FIG. 5 wherein transistors of which sources have been placed in an open state, e.g., NQ11, PQ21 and PQ31, etc. are open also at their gates, respectively.

This modification has a circuit arrangement such that the word lines are connected only to gates of transistors contributing to the formation of output data. Accordingly, this lessens the load on word lines, thus making it possible to accelerate the word line selective operation.

Figure 7:
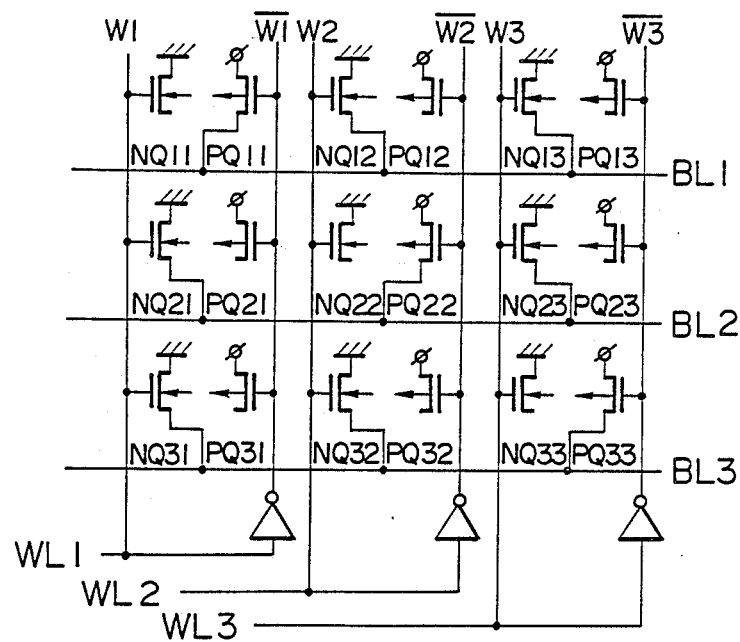

FIG. 7 is a circuit diagram illustrating another embodiment of a ROM device according to the present invention. This circuit is configured so that the sources of the n-channel transistor and the p-channel transistor of each transistor pair are connected to $V_{SS}$ and $V_{DD}$, respectively, and the drain of a transistor paired with each transistor producing a specified output is in an open state.

For instance, considering the first column, the drain of the n-channel transistor NQ11 paired with the p- channel transistor PQ11 of the transistor pair giving the meaning of logical "1" and the drains of the p-channel transistors PQ21 and PQ31 paired with the respective n-channel transistors NQ21 and NQ31 are in an open state. There exists drain capacity in the connection between the bit line and the transistor. Since this drain capacity affects readout speed, it is preferable that the drain is in an open state.

Figure 8:
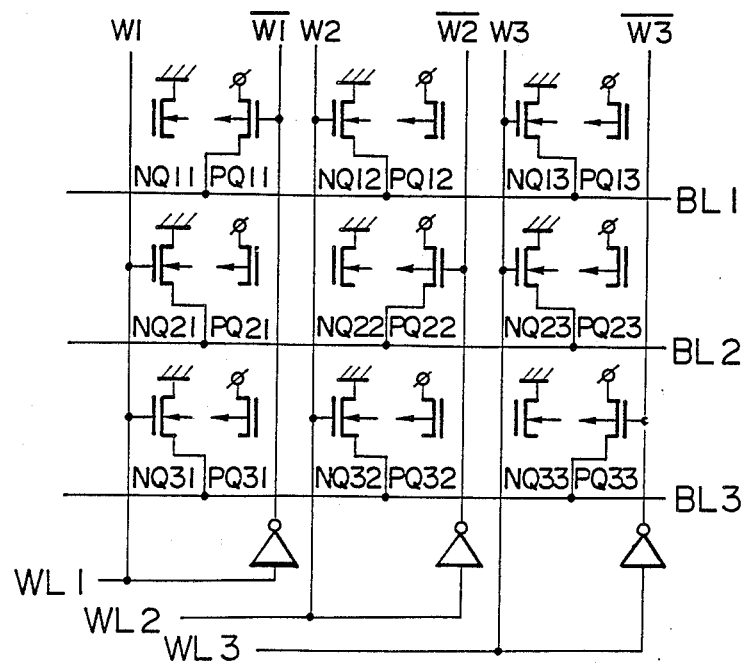

In this instance, as shown in FIG. 8, the gate of each transistor of which drain is in an open state may be opened, thus reducing the load on word lines.

Figure 9A:
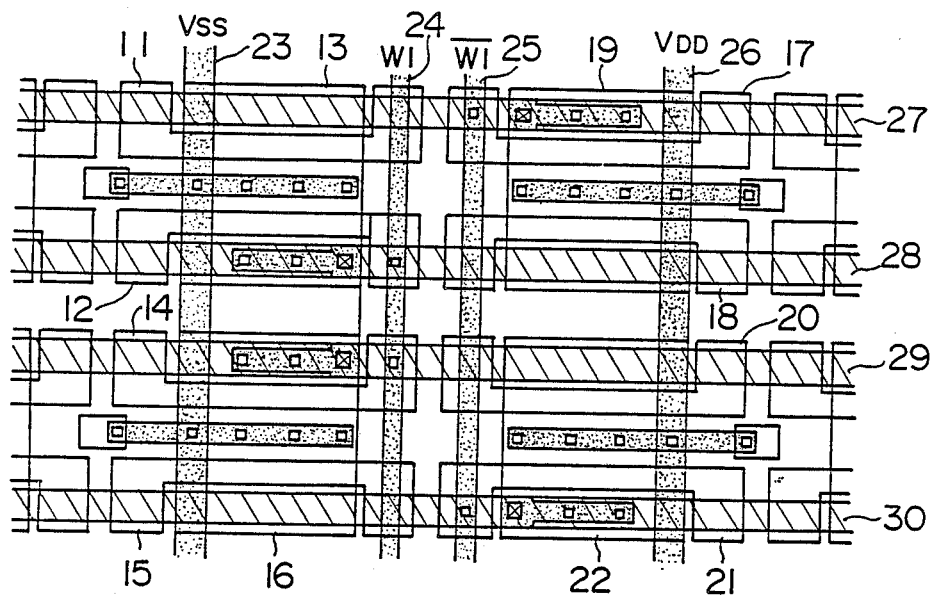
FIG. 9A is a plan view showing a configuration of arranged transistors which are shown in FIG. 9B realized on a master chip.
Figure 9B:
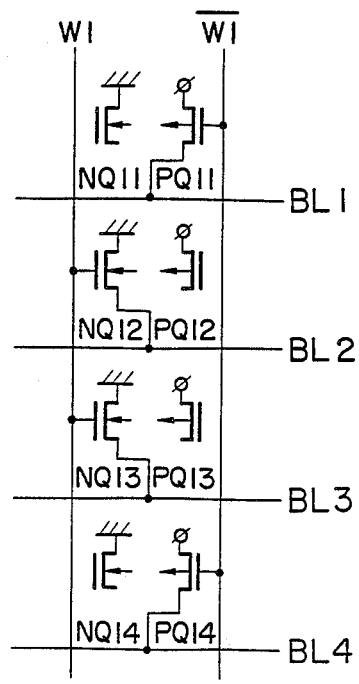
FIG. 9B is a circuit diagram showing a matrix arrangement having four rows and one column of the circuit shown in FIG. 8.

FIG. 9A is an enlarged plan view illustrating a matrix arrangement shown in FIG. 9B which shows a portion of a ROM circuit having the same configuration as that shown in FIG. 8 realized on a master chip.

N-channel transistors NQ11 and NQ12 are comprised of opposing gate electrodes 11 and 12 and n-type impurity diffusion regions 13 intersecting therewith.

N-channel transistors NQ13 and NQ14 are comprised of opposing gate electrodes 14 and 15 and n-type impurity diffusion regions 16 intersecting therewith.

P-channel transistors PQ11 and PQ12 are comprised of opposing gate electrodes 17 and 18 and p-type impurity diffusion regions 19. In addition, p-channel transistors PQ13 and PQ14 are comprised of opposing gate electrodes 20 and 21 and p-type impurity diffusion regions 22 intersecting therewith. Further, on the n-channel transistor column, a $V_{SS}$ line 23 and a W1 word line 24 are formed. On the p-channel transistor column, a $V_{DD}$ line 26 and a $\overline{W1}$ word line 25 are formed. In addition, bit lines 27 (BL1), 28 (BL2), 29 (BL3) and 30 (BL4) are arranged in a lateral direction so that they pass on source regions of the n-channel and p-channel transistors. These wirings and each region are connected through contact holes, whereas no contact hole is provided in each opened portion.

FIG. 10 is a circuit diagram illustrating a further embodiment of a ROM device according to the present invention. In each transistor pair, respective sources and drains are commonly connected to constitute a transmission gate. A point at which drains of each transistor pair are commonly connected is connected to each bit line. For allowing the transistor pair to memorize logical "1", a point at which their sources are commonly connected is connected to $V_{DD}$. For allowing the transistor pair to memorize logical "0", the source common junction is connected to $V_{SS}$. Namely, considering the first column in FIG. 10, the source common junction is connected to $V_{DD}$ in the transistor pair NQ11 and PQ11 giving the meaning of logical "1", and the source common junctions are connected to $V_{SS}$ in the transistor pairs NQ21 and PQ21, and NQ31 and PQ31 giving the meaning of logical "0". Such a transmission gate can perfectly perform level transmission, with the result that it is effective when raising the bit line to H level and is advantageous in the realization of bidirectional transmission.

FIG. 11 shows a modification of the embodiment shown in FIG. 10. In this circuit, the transmission gate is used in each transistor pair used for raising a potential on the bit line, but only the n-channel transistor is used as each transistor used for pulling down a potential on the bit line. For instance, considering the first column, for giving the meaning of logical "0", sources of the n-channel transistors NQ21 and NQ31 are connected to $V_{SS}$, but drains of the p-channel transistors PQ21 and PQ31 are in an open state, with the result that they do not contribute to pull-down of the potential.

In this modified embodiment, it is also possible to place the gate of each p-channel transistor which does not contribute to an output of data indicative of logical "0" in an open state, thus reducing the load on word lines.

Figure 12A:
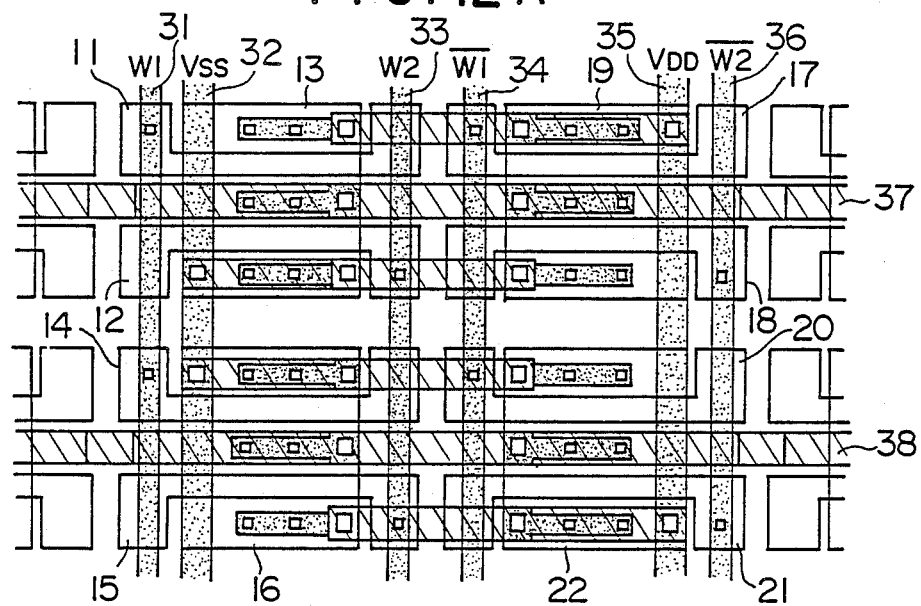
FIG. 12A is a configuration of arranged transistors which are shown in FIG. 12B realized on a master chip.
Figure 12B:
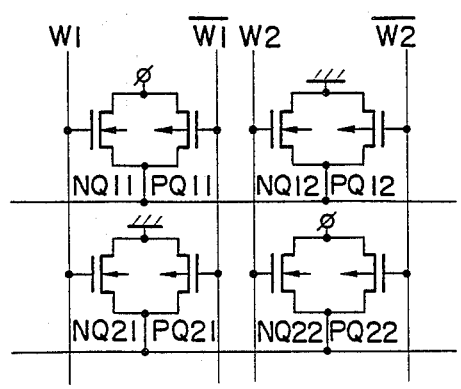
FIG. 12B is a circuit diagram showing a matrix arrangement having two rows and two columns of the circuit shown in FIG. 10.

FIG. 12A is an enlarged plan view illustrating a matrix arrangement shown in FIG. 12B which shows a portion of the circuit shown in FIG. 10 realized on an actual master chip. In accordance with this configuration, since the same master chip as in FIG. 9 is used, four n-channel transistors formed by the gates 11, 12, 14 and 15 and n-type impurity diffusion regions 13 and 16 positioned at the left-half and four p-channel transistors formed by gates 17, 18, 20 and 21 and p-type impurity diffusion regions 19 and 22 positioned at the right-half are the same as those in FIG. 9. On this master chip, a word line (W1) 31, a $V_{SS}$ line 32, a word line (W2) 33, a word line ($\overline{W1}$) 34, a $V_{DD}$ line 35 and a word line ($\overline{W2}$) 36 are arranged as different layers in a vertical direction, respectively. Moreover, bit lines 37 (BL1) and 38 (BL2) are formed thereon as different layers in a lateral direction, respectively. By providing suitable contacts on this chip, the circuit shown in FIG. 10 is thus realized.

In the above-mentioned embodiments, ROMs of the OR type have been described. However, it is needless to say that the present invention is applicable to well known ROMs of the AND type.

Although ROMs for realizing logic for gate array have been described in the above-mentioned embodiments, the present invention can be applied to ROMs as memory devices assembled into the gate array or ordinary ROMs.

As described in detail, the ROM device according to the present invention is configured so that a plurality of transistor pairs each comprising a transistor of one conductivity type and a transistor of an opposite conductivity type are formed in a matrix manner, and that the transistors of the one conductivity type output one memory logic and the transistors of the other conductivity type output the other memory logic. Accordingly, the ROM device effects static operation, thus eliminating the need of the precharge and the clock operations. This ROM is essentially configured as a CMOS circuit, resulting in low power consumption. Further, there are used transistors having respective characteristics suitable for raising and pulling down a potential on the output line, leading to a large operation margin. Accordingly, this results in a large production margin and improved yields. Furthermore, since p-channel and n-channel transistors which are the same in number are used, element utilization factor is high and a ROM having a large capacity and small occupation area can be configured, thus providing an inexpensive and high performance read only semiconductor device.

In addition, when there is employed a transmission gate comprising two kinds of transistors of which respective drains and sources are commonly connected, reliable and high speed operation for raising a potential on the output line can be realized.

What is claimed is:

1. A read only semiconductor memory device comprising:
   a plurality of transistor pairs arranged in a matrix manner;
   each transistor pair comprising a transistor of one conductivity type responsive to one input to output a high level logic, and a transistor of an opposite conductivity type responsive to one input to output a low level logic;

input lines for connecting transistors of the same columns of said transistor pairs; and output lines for connecting transistors of the same rows of said transistor pairs, thus allowing only one of two transistors constituting said transistor pair to be operated thereby to obtain a predetermined logical output;

said transistor of said one conductivity type being operated so as to raise a potential on said output line to high level, said transistor of the other conductivity type being operated so as to pull down a potential on said output line to low level;

said matrix being configured as a CMOS master chip on which two conductivity type transistors are regularly arranged.

2. A read only semiconductor memory device comprising:

a plurality of transistor pairs arranged in a matrix manner, each transistor pair comprising two transistors of one conductivity type and the other conductivity type which are commonly connected at their sources and drains, respectively, input lines for connecting transistors of the same columns of said transistor pairs, and output line for connecting transistors of the same rows of said transistor pairs, a common connecting point for sources of the transistor pair for outputting one logic being connected to a source for delivering one level, and a common connecting point for sources of the transistor pair for outputting the other logic being connected to a source for delivering the other level, said matrix being configured as a CMOS master chip on which the two conductivity type transistors are regularly arranged.

3. A read only semiconductor memory device comprising:

a plurality of transistor pairs arranged in a matrix manner, each transistor pair comprising a transistor of one conductivity type responsive to one input to output one logic and a transistor of an opposite conductivity type responsive to one input to output the other logic;

input lines for connecting transistors of the same columns of said transistor pairs, output lines for connecting transistors of the same rows of said transistor pairs, the transistor pairs which output one logic being commonly connected at their sources and drains, respectively, a common connecting point for sources being connected to a source for said one level, and a common connecting point for drains being connected to said output line;

the transistor pairs which output the other logic being such that only the transistors of said opposite conductivity type for pulling down a potential on said output line to the other level is operated;

said matrix being configured as a CMOS master chip on which the two conductivity type transistors are regularly arranged.

4. The read only semiconductor memory device as set forth in claim 1, wherein said transistor of said one conductivity type is a p-channel transistor, and said transistor of said opposite conductivity type is an n-channel transistor.

5. The read only semiconductor memory device as set forth in claim 1, wherein each of said input lines is a word line, and each of said output lines is a bit line.

6. The read only semiconductor memory device as set forth in claim 4, wherein said p-channel transistor for outputting high level logic has a source connected to a drain supply voltage $V_{DD}$, a gate connected to said word line, and a drain connected to said bit line, and said n-channel transistor for outputting low level logic has a source connected to a source supply voltage $V_{SS}$, a gate connected to a word line of an opposite logic to said word line, and a drain connected to said bit line.

7. The read only semiconductor memory device as set forth in claim 6, wherein the transistor which does not produce a logic output of said transistor pairs has a connection relationship such that at least one of its source and drain is not connected.

8. The read only semiconductor memory device as set forth in claim 7, wherein the gate of said transistor which does not produce a logical output is not connected to said word line.

9. The read only semiconductor memory device as set forth in claim 1, wherein each of said transistor pairs is representative of a unit logical output of a gate array.

10. The read only semiconductor memory device as set forth in claim 1, wherein each of said transistor pairs is representative of a unit logical output of a read only semiconductor memory unit.

11. The read only semiconductor memory device as set forth in claim 2, wherein said one level and the other level represent a drain supply voltage $V_{DD}$ and a source supply voltage $V_{SS}$, respectively, said one logic and the other logic represent high level logic and low level logic, respectively, and said transistors of said one conductivity type and opposite conductivity type represent a p-channel transistor and an n-channel transistor, respectively.

12. The read only semiconductor memory device as set forth in claim 11, wherein said input lines are word lines logically opposite to each other commonly connected to the gate of the transistor of said one conductivity type of the transistors of the same column, and each of said output lines is a bit line connected to the drain common junction of the transistor pairs of the same row.

13. The read only semiconductor memory device as set forth in claim 3, wherein said one level and the other level represent drain and source power supply voltages, respectively, said one logic and the other logic represent high level logic and low level logic, respectively, said transistor of said one conductivity type being a p-channel transistor, said transistor of said the other conductivity type being an n-channel transistor.

14. The read only semiconductor memory device as set forth in claim 13, wherein said input line is word lines logically opposite to each other commonly connected to gates of transistors of the same conductivity type of said transistor pairs, said output line is a bit line connected to a drain common junction of the transistor pairs of the same row.

* * * * *